United States Patent [19]

Krautschneider et al.

[11] Patent Number: 5,471,417
[45] Date of Patent: Nov. 28, 1995

[54] FERROELECTRIC MEMORY CELL ARRANGEMENT

[75] Inventors: Wolfgang Krautschneider, Ottobrunn; Wolfram Wersing, Kirchheim, both of Germany

[73] Assignee: Siemens Aktiengesellschaft, Munich, Germany

[21] Appl. No.: 87,814

[22] PCT Filed: Dec. 10, 1991

[86] PCT No.: PCT/DE91/00957

§ 371 Date: Jul. 9, 1993

§ 102(e) Date: Jul. 9, 1993

[87] PCT Pub. No.: WO92/12518

PCT Pub. Date: Jul. 23, 1992

[30] Foreign Application Priority Data

Jan. 9, 1991 [DE] Germany ............... 41 00 465.5

[51] Int. Cl.⁶ .................................. G11C 11/22
[52] U.S. Cl. ............... 365/145; 365/185.13; 257/295; 257/330
[58] Field of Search ................... 365/145, 184, 365/149, 185; 257/295, 330, 328, 329, 397, 396, 513

[56] References Cited

U.S. PATENT DOCUMENTS

| | | | |
|---|---|---|---|
| 4,427,989 | 1/1984 | Anantha | 257/513 |
| 4,829,351 | 5/1989 | Engles et al. | 365/185 |
| 4,920,397 | 4/1990 | Ishijima | 257/903 |
| 5,198,994 | 3/1993 | Natori | 365/145 |
| 5,237,188 | 8/1993 | Iwai | 257/411 |

FOREIGN PATENT DOCUMENTS

| | | |
|---|---|---|
| 0099473 | 2/1984 | European Pat. Off. . |
| 0130614 | 9/1985 | European Pat. Off. . |
| 3212945 | 12/1982 | Germany . |

OTHER PUBLICATIONS

"A Metal–Insulator–Semiconductor (MIS) Device Using a Ferroelectric Polymer Thin Film in the Gate Insulator", Japanese Journal of Applied Physics, vol. 25, No. 4, Apr. 1986, pp. 590–594.
Proceedings of the IEEE, vol. 64, No.7, 1976, p. 1053.
"Integrated Devices", Semiconductor Devices Physics and Technology, pp. 486–490. S. M. Sze. 1981.

Primary Examiner—A. Zarabian
Attorney, Agent, or Firm—Hill, Steadman & Simpson

[57] ABSTRACT

In the memory cell arrangement, each memory cell consists of a field-effect transistor comprising a gate dielectric (14) which contains at least one ferroelectric layer (142). Depending on the sign of the remanent polarization of the ferroelectric layer (142), the field-effect transistor exhibits one of two different threshold voltages which have the same sign and which are allocated to the logic states "0" and "1". Information is written in by repolarizing the ferroelectric layer (142), information items are read by applying a voltage to the gate electrode of the field-effect transistor, the voltage being between the two threshold voltages.

12 Claims, 4 Drawing Sheets

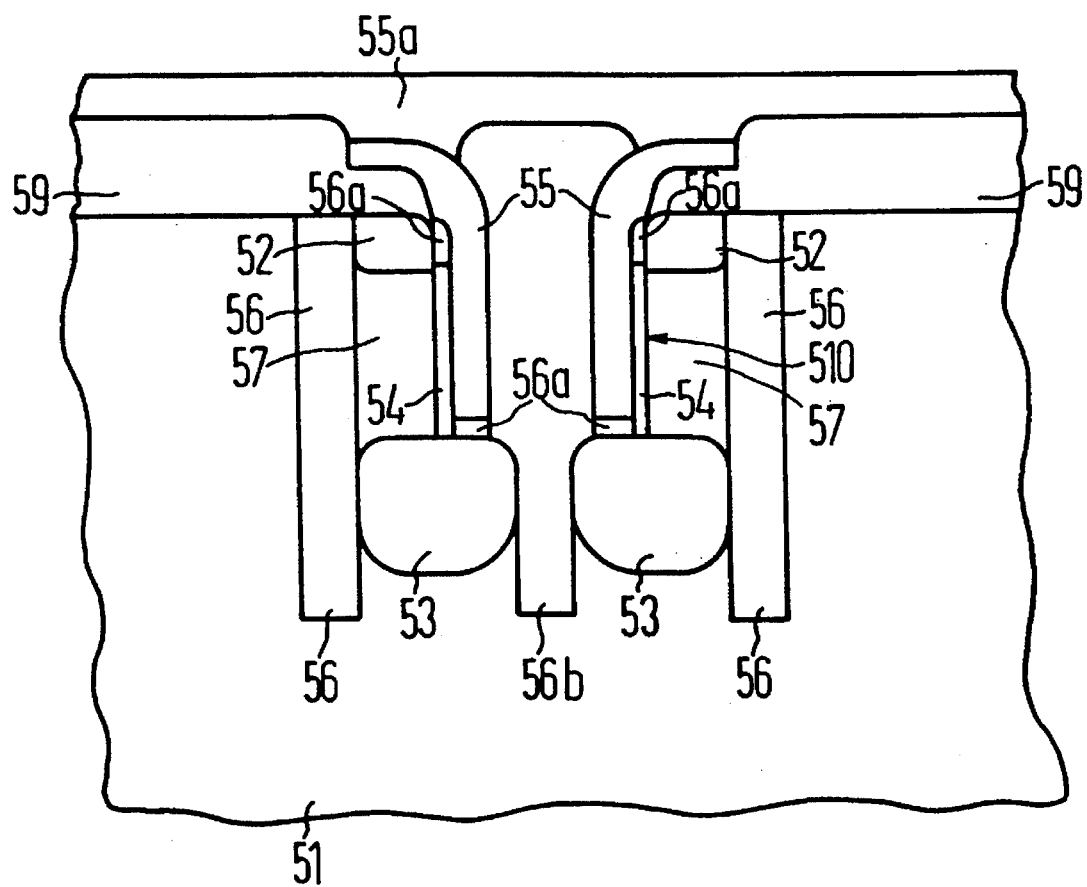

FERROELECTRIC MEMORY CELL ARRANGEMENT

BACKGROUND OF THE INVENTION

1. Field of the Invention

The present invention relates generally to non-volatile memory cells.

2. Description of the Related Art

Memory cells comprising semiconductor components which are operated as dynamic or static memories generally loose the stored information after the supply voltage has been switched off. In the case of a spontaneous voltage failure, all data stored in these memories are erased.

In the case of memory cell arrangements which are built up from dynamic single-transistor cells, the additional disadvantage is that a refresh must be carried out at regular time intervals for compensating for the charge drained by leakage currents. This increases power consumption and circuit complexity.

Furthermore, dynamic memories are sensitive against alpha radiation. This produces error bits.

It is known (see for example S. M. Sze, Semiconductor Devices, John Wiley & Sons 1985, p. 490), to use so-called electrically programmable memories (EPROM) or electrically programmable and erasable memories (EEPROM) for permanent storage. In these non-volatile memories, the load is retained when the voltage supply is switched off. In these memories, the information is stored with the aid of the charging-up of a floating gate by the injection of hot charge carriers or Fowler-Nordheim tunnel current or by charging up impurity traps and dielectric boundary layers (NMOS transistors). In this arrangement, the floating gate or the impurity traps are surrounded by a high-quality insulator so that there is virtually no charge drainage.

A disadvantage of these memories is that the write process takes place with time constants in the millisecond range, that is to say is relatively slow. A further disadvantage consists in that the high-quality insulator becomes fatigued after about $10^3$ to $10^6$ write cycles. After that, no further permanent charge storage can then be carried out.

SUMMARY OF THE INVENTION

The invention is based on the problem of specifying a memory cell arrangement and a method for operating it, in which the stored information is retained when the supply voltage fails and in which the write process is faster than in the known arrangements.

According to the invention, the problem is solved by means of a memory cell arrangement having the following features:

a) in a semiconductor substrate, at least one field-effect transistor having a source region, a drain region, a gate dielectric and a gate electrode is provided as a memory cell, the semiconductor substrate being doped with a first type of conductivity and the source region and the drain region being doped with a second type of conductivity which is opposite to the first type of conductivity, and b) the gate dielectric contains at least one ferroelectric layer.

By using a ferroelectric layer as gate dielectric, the memory cell arrangement according to the invention avoids the abovementioned disadvantages of the prior art.

Ferroelectric materials such as, for example, lead zirconate titanate, can be remanently polarized by applying an electrical field which is greater than a material-specific saturation field strength. The sign of the remanent polarization can be changed by reversing the direction of the electrical field. A field-effect transistor which contains a ferroelectric layer as a gate dielectric exhibits one of two different threshold voltages at which current flow starts depending on the sign of the polarization of the ferroelectric layer.

This property is utilized in the memory cell arrangement according to the invention for building up a memory cell comprising a ferroelectric transistor. The logic states "0" and "1" are assigned to the two alternate threshold voltages.

Since the state of polarization of the ferroelectric layer is retained even without an external field, no loss of information occurs after the supply voltage has been switched off. In addition, the memory cell arrangement according to the invention does not require any refresh and the memory cells are insensitive to alpha radiation.

In the memory cell arrangement according to the invention, a complete memory cell only consists of the field effect transistor with the ferroelectric layer as a gate dielectric. The field-effect transistor is used both for information storage and for cell selection during the reading-out of the memory cell arrangement. The prerequisite for the use of the field-effect transistor for cell selection is that both threshold voltages have the same sign, that is to say, when the field-effect transistor is an n-channel transistor, that both threshold voltages are positive and, when the field-effect transistor is a p-channel transistor, both threshold voltages are negative. The two threshold voltages of the field-effect transistor can be adjusted in such a manner that both of them have the same sign. The level amount of the threshold voltages increased by higher substrate doping whereas a lesser thickness of the gate dielectric reduces the amount of the threshold voltage. Furthermore, the amount of the threshold voltage can be increased by changing the difference in work function between the gate electrode and the semiconductor substrate. This is done, for example, by using a gate electrode of polysilicon which is doped with the opposite type of conductivity from the source and drain region. These measures which adjust the threshold voltages of the field-effect transistor are independent of the choice of material for the ferroelectric layer.

For reading out the information written into a selected memory cell, a voltage is applied to a word line which is connected to the gate electrode of the selected memory cell. The amount of the voltage is between the two values of the amounts of the threshold voltages so that, when this voltage is present, the field-effect transistor is either turned off or turned on depending on the state of polarization of the ferroelectric layer. When the ferroelectric layer is polarized in such a manner that the amount of the threshold voltage of the field-effect transistor has the higher value, no current flow starts so that a logical "0" is read out. If, however, the ferroelectric layer is polarized in such a manner that the threshold voltage assumes the smaller value by amount, the transistor conducts, which is associated with a stored "1".

For writing information into a selected memory cell, a field which exceeds the saturation field strength of the ferroelectric layer must be applied between its gate electrode and the substrate. The direction of the polarization of the ferroelectric layer then becomes oriented in accordance with the field which sets the threshold voltage of the memory transistor.

For the threshold voltage of the field-effect transistor, which is, for example, an n-channel transistor, assume the lower of the two possible values, the required polarization field must be generated by means of a sufficiently high voltage between the gate electrode and the substrate. For this purpose, a positive voltage, the amount of which is greater than the saturation field strength required for the repolarization of the ferroelectric layer is applied to the gate electrode via a word line, whereas the source region, the drain region and the substrate are connected to zero potential.

To prevent the ferroelectric layer from also becoming repolarized in unselected memory cells of the memory cell arrangement, the gate electrodes of which are connected to the selected word line, the electric field over the ferroelectric layer of these memory cells must be reduced. This is achieved, for example, by appropriately raising the potential present at the source region and at the drain region, for example to half the value which is present at the word line. Since the voltage present at the word line is far above the threshold voltage, the semiconductor surface under the gate dielectric is inverted. The field strength over the ferroelectric layer is therefore set by the channel potential, which is determined by the voltage of the drain region and the source region, to a value at which repolarization of the ferroelectric layer does not yet occur.

Another possibility for reducing the field strength over the ferroelectric layer of unselected memory cells consists in individually applying a voltage corresponding to half the value of the voltage applied to the word line at the substrate below the ferroelectric layer in these memory cells. This limits the field strength over the ferroelectric layer to a value which does not yet lead to the repolarization of the ferroelectric layer. For this purpose, insulation areas are provided in the memory cell arrangement according to the invention, which insulate from one another field-effect transistors in the substrate which are connected to the same word line. BOX-type insulations, for example, are suitable as insulation areas. Below each field-effect transistor, a first doped layer which is doped like the substrate of the first type of conductivity, and a second doped layer which is doped like the source and drain regions of the second type of conductivity, is provided in the substrate. The first doped layer and the second doped layer are laterally bounded by the insulation areas insulating the respective field-effect transistor. The first doped layer in this arrangement represents an "individual substrate" which is insulated from the general substrate by pn junctions. The potential for reducing the field strength over the ferroelectric layer is applied in the unselected memory cells via the first doped layer.

According to one embodiment of the invention, a third doped layer which is doped with the first type of conductivity is arranged below the second doped layer in the substrate and a fourth doped layer, which is doped with the second type of conductivity, is arranged below the third doped layer. The third doped layer and the fourth doped layer in this arrangement are also laterally bounded by the insulation area insulating the respective field-effect transistor. The dopant concentrations of the doped layers in this arrangement are adjusted in such a manner that the Zener diodes formed from the first doped layer and the second doped layer and the Zener diodes formed from the second doped layer and the third doped layer have breakdown voltages which are in the vicinity of the voltage required for the repolarization of the ferroelectric layer. If a voltage which exceeds the saturation field strength for repolarization of the ferroeleotric layer is applied between the third doped layer and the gate electrode in such a memory cell, the breakdown voltage of the Zener diodes is exceeded so that the applied voltage is dropped almost completely across the ferroelectric layer. If, on the other hand, a lower voltage level is applied to the third doped layer, for example half the saturation field strength, the breakdown voltage of the Zener diodes is not reached. Only a low voltage then forms across the ferroelectric layer, the value of which is far below the voltage value present between the gate electrode and the third doped layer. In this embodiment, a partial repolarization of the ferroelectric layer that could otherwise occur in the case of voltages over the ferroelectric layer which are only a little below the polarization field strength is avoided.

So that the ferroelectric layer is polarized in such a manner that the threshold voltage of the field-effect transistor assumes the greater of the two possible values, source and drain region are connected to a positive voltage which corresponds to the saturation field strength, whereas the gate electrode of the relevant cell is connected to zero potential. The ferroelectric layer is then repolarized in the area of the source and drain region in the selected memory cell. The potential of the word lines of the remaining memory cells which are connected to the same drain and bit lines is raised to a positive voltage value which is less than the saturation field strength. As a result, the field strength required for repolarization is not reached in these memory cells.

To be able to repolarize the ferroelectric layer in the entire gate region, it is advantageous to provide the first doped layer of the first type of conductivity below the gate dielectric and underneath that the second doped layer of the second type of conductivity and to insulate by means of insulation areas the field-effect transistors that are connected to the same word line. The first doped layer of the selected memory cell is then also connected to the saturation field strength corresponding to the positive voltage.

In the embodiment of the memory cell arrangement in which the third doped layer and the fourth doped layer are provided, the word line of the selected memory cell is connected to zero potential whereas the third doped layer is connected to a positive voltage according to the saturation field strength. As a result, the breakdown voltage of the Zener diodes is exceeded so that the applied voltage is almost completely dropped across the ferroelectric layer and the ferroelectric layer is repolarized. The word lines of the remaining unselected memory cells are connected to a positive voltage which is, for example, half the saturation field strength. As a result, the breakdown voltage of the Zener diodes is not reached in these memory cells. The field strength which is present at the ferroelectric layer is then so low that its state of polarization remains unchanged.

So that, when a silicon monocrystal is used as the substrate, good crystal surfaces having low phase boundary state densities in the channel region of the field-effect transistors are produced, it is advantageous to construct the gate dielectric as a multi-layer dielectric. The gate dielectric consists of a thin first $SiO_2$ layer on the silicon substrate, the ferroelectric layer and of a second $SiO_2$ layer to which the gate electrode, for example, of polycrystalline silicon, is applied. In this embodiment, stable threshold voltages are achieved.

To be able to influence the threshold voltage of the field-effect transistors effectively by repolarizing the ferroelectric layer, it is advantageous to select the thicknesses of the $SiO_2$ layers and of the ferroelectric layer in such a manner that the ratio between the relative dielectric constants of the ferroelectric layer and the $SiO_2$ layer is comparable with the ratio of the layer thicknesses.

It is within the scope of the invention to arrange the field-effect transistors at opposite side walls of a longitudinal trench in the substrate. As a result, very small cell areas are achieved.

BRIEF DESCRIPTION OF THE DRAWINGS

In the text which follows, the invention will be explained in greater detail with reference to illustrative embodiments and to the figures, in which:

FIG. 10 shows a memory cell arrangement with memory cells arranged in a trench, in which individual substrate voltages are applied to the individual memory cells.

BRIEF DESCRIPTION OF THE PREFERRED EMBODIMENTS

Figure 1:
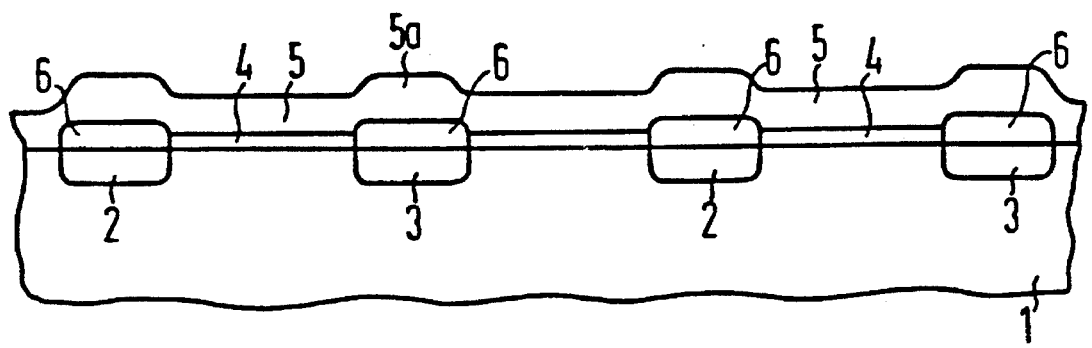
FIG. 1 shows a memory cell arrangement with field-effect transistors, in the gate dielectric of which a ferroelectric layer is contained.

In a substrate 1, which consists, for example of monocrystalline silicon and is, for example, p-doped, field-effect transistors are contained as memory cells (see FIG. 1). The field-effect transistors in each case contain a source region 2 which is, for example, n$^+$-doped, and a drain region 3 which is also, for example, n$^+$-doped. On the surface of the substrate 1, a gate dielectric 4 is in each case arranged between the source region 2 and the drain region 3. The gate dielectric 4 contains a ferroelectric layer, for example of lead zirconate titanate. Above the gate dielectric 4, a gate electrode 5 is arranged which consists, for example, of polycrystalline silicon. Each field-effect transistor has two different positive threshold voltages, the applicable threshold voltage being dependent on the state of polarization of the ferroelectric layer, which voltages are allocated to two different logic states in the memory cell arrangement. An electric field which is greater than the saturation field necessary for repolarizing the ferroelectric layer is applied between the gate electrode 5 and the substrate 1 for repolarizing the ferroelectric layer and thus for switching from one value of the threshold voltage to the other. In this arrangement, one or the other threshold voltage is set depending on the direction of the electric field.

Figure 2:
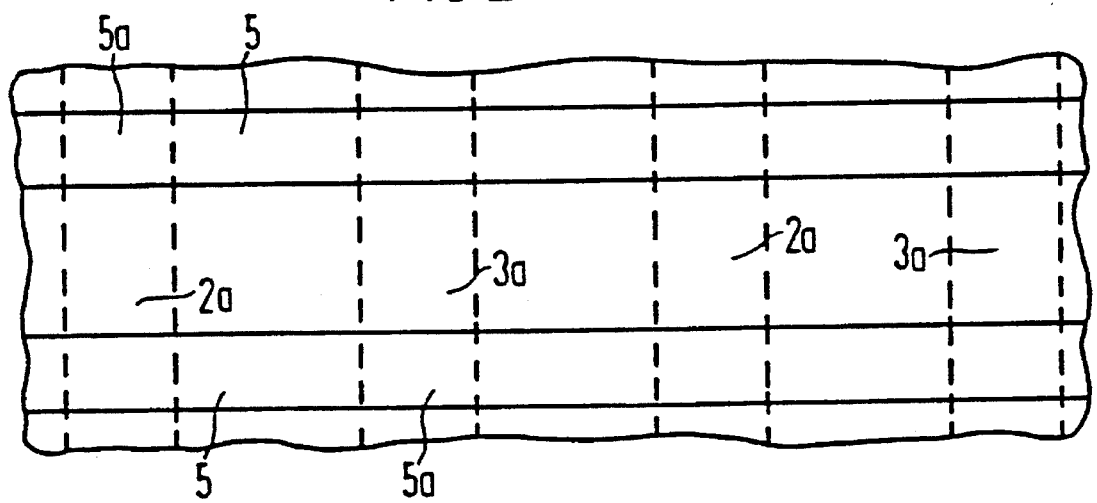
FIG. 2 shows a top view of the memory cell arrangement shown in FIG. 1.

The field-effect transistors are arranged matrix-like in rows and columns in the substrate 1. In this arrangement, the gate electrodes 5 of each column are in each case connected to one word line 5a (see FIG. 2). The word line 5a and the gate electrodes 5 are constructed, for example, as a continuous polycrystalline silicon layer. In the substrate, the source regions 2 of the field-effect transistors in each case arranged in a row are connected to one another via a bit line 2a. The drain regions 3 of the field-effect transistors, which are arranged in a row in the substrate 1, are connected to one another via a drain line 3a. The bit line 2a and the drain line 3a are constructed, for example, as continuous diffusion regions in the substrate 1 containing the source regions 2 and the drain regions 3, respectively. The source regions 2 and the drain regions 3 are in each case insulated from the word lines 5a by means of insulating areas 6 at points of intersection with the word lines 5a (see FIG. 1).

Figure 3:
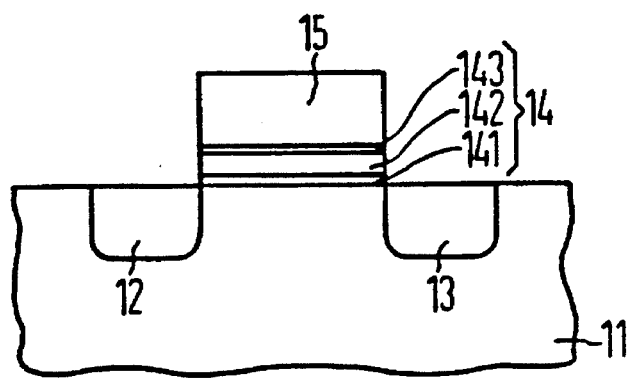
FIG. 3 shows a field-effect transistor of the memory cell arrangement according to the invention, comprising a multi-layer dielectric.

In a substrate 11 of, for example, p-doped monocrystalline silicon, a source region 12 and a drain region 13 are arranged (see FIG. 3). A gate dielectric 14 is arranged at the surface of the substrate 11 between the source region 12 and the drain region 13. The gate dielectric 14 is composed of a first SiO$_2$ layer 141, a ferroelectric layer 142 and a second SiO$_2$ layer 143. The ferroelectric layer 142 consists, for example, of lead zirconate titanate. The ratio between the thickness of the SiO$_2$ layers and the ferroelectric layer 142 in this arrangement is approximately equal to the ratio between the dielectric constants of SiO$_2$ and the ferroelectric referred to the polarization of the ferroelectric. The thicknesses are, for example, 100 nm for the ferroelectric layer 142 and in each case 5 nm for the SiO$_2$ layers 141, 143. A gate electrode 15 is arranged on the gate dielectric 14. The gate electrode 15 consists, for example, of polycrystalline silicon. A good crystal surface having low phase boundary state densities in the channel region, which is of importance for obtaining stable threshold voltages, is achieved by using the first SiO$_2$ layer 141 on the surface of the substrate 11.

Figure 4:
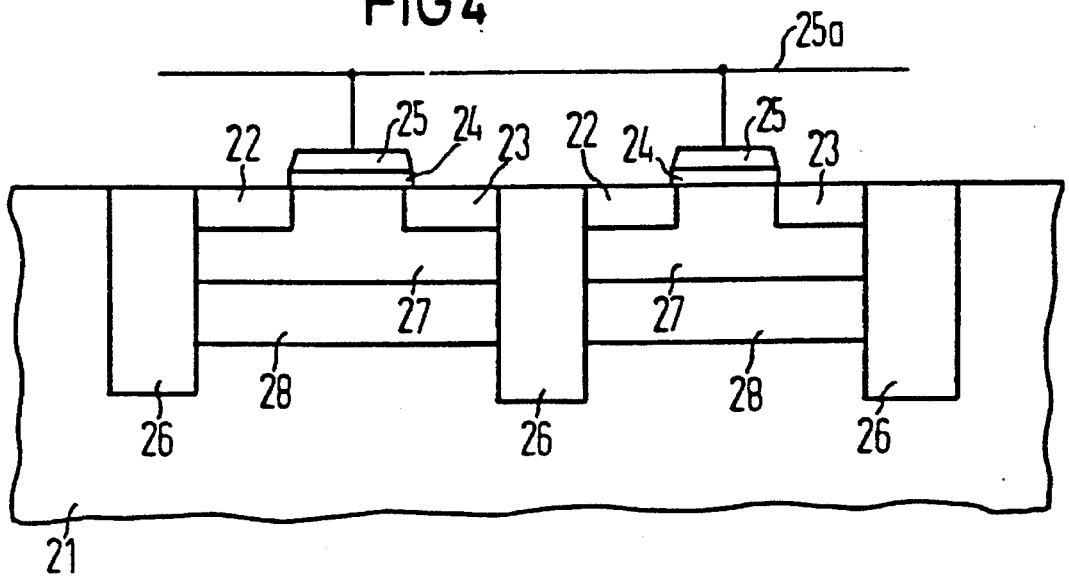
FIG. 4 shows a section from a memory cell arrangement in which individual substrate voltages are applied to the individual memory cells.

In a substrate 21 of, for example, p-doped monocrystalline silicon, field-effect transistors having in each case a source region 22 and a drain region 23 are arranged as memory cells (see FIG. 4). The source region 22 and the drain region 23 are in each case n$^+$-doped. Between the source region 22 and the drain region 23, a gate dielectric 24 is arranged at the surface of the substrate 21. The gate dielectric 24 contains a ferroelectric layer of, for example, lead zirconate titanate. The gate dielectric 24 is constructed, for example, as a multi-layer dielectric consisting of a first thin SiO$_2$ layer, the ferroelectric layer and a second thin SiO$_2$ layer. On the gate dielectric 24, a gate electrode 25 of, for example, polycrystalline silicon is arranged (see FIG. 4). The field-effect transistors are arranged matrix-like in rows and columns in the substrate 21. In this arrangement, the gate electrodes 25 of a column are connected to one another via a word line 25a. The source regions 22 and the drain regions 23 of the field-effect transistors which are arranged in a row extending perpendicularly to the plane of the drawing are in each case mutually connected to one another via a bit line or a drain line (not shown in this section). Field-effect transistors, the gate electrodes of which are connected to the same word line 25a, are isolated from one another by means of insulation areas 26 in the substrate 21. The insulation areas 26 are constructed, for example, as BOX-type insulations or as trenches filled with insulation material. In the substrate 21, a first doped layer 27 is arranged below the source region 22 and the drain region 23. The first doped layer 27 is of the same type of conductivity as the substrate 21, for example p-doped. The first doped layer 27 extends between the source region 22 and the drain region 23 to the gate dielectric 24. The first doped layer 27 is laterally bounded by the insulation areas 26. Below the first doped layer 27, a second doped layer 28 is arranged which is of the opposite type of conductivity from the first doped layer 27, that is to say the second doped layer 28 is, for example, n-doped. The second doped layer 28 is laterally also bounded by the insulation areas 26. An individual substrate voltage which is independent of the other field-effect transistors on the same word line 25a can be applied via the first doped layer 27 for each field-effect transistor whose gate electrode 25 is connected to the word line 25a. The first doped layer 27 therefore has the effect of a substrate line. The first doped layer 27 is also dielectrically insulated from the general substrate 21 by the pn junctions at the surfaces of the second doped layer 28.

To adjust the threshold voltage of a predetermined field-effect transistor to the lower of the two possible values, a sufficiently high positive voltage is applied to the gate electrode 25 via the word line 25a. The first doped layer 27 is set to zero potential for the predetermined field-effect transistor and to a positive voltage value for the remaining field-effect transistors connected to the same word line 25a, for example to half the voltage present at the word line 25a. As a result, the saturation field strength for repolarization of the ferroelectric layer is only achieved in the predetermined field-effect transistor.

To set the threshold voltage of the predetermined field-effect transistor to the higher of the possible values, zero potential is applied to the word line 25a of the predetermined field-effect transistor. A voltage which is sufficiently high for repolarization is applied to the source region 22, the drain region 23 and the first doped layer 27. The word lines of all field-effect transistors connected to the same drain and bit line are connected to a positive voltage which is, for example, half as large as the voltage connected to the word line 25a of the selected field-effect transistor. As a result, the saturation field strength for repolarizing the ferroelectric layer is again only achieved at the selected field-effect transistor.

Figure 5:
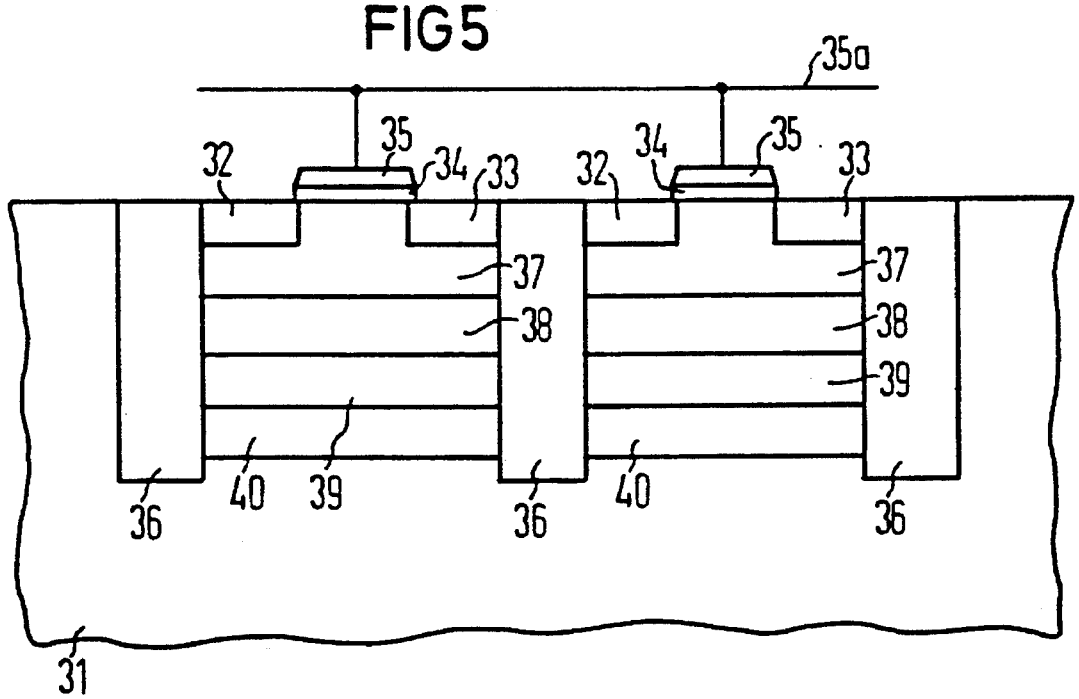
FIG. 5 shows a memory cell arrangement with Zener diodes integrated in the substrate.

In a substrate 31 which consists, for example, of p-doped monocrystalline silicon, field-effect transistors are arranged as memory cells matrix-like in columns and rows (see FIG. 5). Each field-effect transistor contains a source region 32 and a drain region 33 which are $n^+$-doped. A gate dielectric 34 is arranged between the source region 32 and the drain region 33 on the surface of the substrate 31. The gate dielectric 34 contains a ferroelectric layer, for example of lead zirconate titanate. The gate dielectric 34 is constructed, for example, as a multi-layer dielectric comprising a first SiO$_2$ layer, the ferroelectric layer and a second SiO$_2$ layer. A gate electrode 35 is arranged on the gate dielectric 34. The gate electrodes 35 of all field-effect transistors arranged in a column are connected to one another via a word line 35a. The field-effect transistors, the gate electrodes 35 of which are connected to one another via the word line 35a, are laterally insulated from one another by means of insulation areas 36 in the substrate 31. The insulation areas 36 consist, for example, of BOX-type insulations or of trenches filled with insulation material (see FIG. 5).

The source regions 32 of all field-effect transistors arranged in a row (extending perpendicularly to the plane of the drawing) are connected to one another via a bit line. The drain regions 33 of the field-effect transistors arranged in one row (extending perpendicularly to the plane of the drawing) are connected to one another via a drain line.

A first doped layer 37 is arranged below the source region 32 and the drain region 33. The first doped layer 37 is of the same type of conductivity as the substrate 31, that is to say, for example, p-doped and extends to the gate dielectric 34 between the source region 32 and the drain region 33. The first doped layer 37 is laterally bounded by the insulation areas 36. A second doped layer 38 is arranged below the first doped layer 37. The second doped layer 38 is of a type of conductivity opposite to that of the first doped layer 37, that is to say, for example, n-doped. The second doped layer 38 is laterally bounded by the insulation areas 36. The first doped layer 37 and the second doped layer 38 are interrupted perpendicularly to the plane of the drawing by insulations which in each case bound the area of each field-effect transistor. These insulations are constructed, for example, as BOX-type insulations and extend from the substrate surface to the lower edge of the second doped layer 38.

Below the second doped layer 38, a third doped layer 39 is arranged which is of the same type of conductivity as the substrate 31, that is to say p-doped. The third doped layer 39 is laterally bounded by the insulation areas 36 and extends perpendicularly to the plane of the drawing below all field-effect transistors arranged in one row. Below the third doped layer 39, a fourth doped layer 40 is arranged which is of the same type of conductivity as the second doped layer 38, that is to say, for example, n-doped. The fourth doped layer 40 is laterally bounded by the insulation areas 36 and extends perpendicularly to the plane of the drawing below all field-effect transistors arranged in one row.

The pn junctions at the boundary face between the first doped layer 37 and the second doped layer 38 and at the boundary face between the second doped layer 38 and the third doped layer 39 form two Zener diodes which are connected in series with opposite polarity.

In this embodiment, the third doped layer 39 acts as a substrate line via which an individual substrate voltage is applied to each field-effect transistor independently of the field-effect transistors connected to the same word line. The third doped layer 39 is dielectrically insulated from the general substrate 31 by means of the fourth doped layer 40.

The doping of the first doped layer 37, of the second doped layer 38 and of the third doped layer 39 is adjusted in such a manner that the two Zener diodes exhibit a breakdown voltage which is exceeded when the voltage level for repolarizing the ferroelectric layer is applied. When half the voltage level is applied, however, the breakdown voltage of the Zener diodes is not reached. The Zener diodes exhibit, for example, doping in the region around approximately $10^{10}$ cm$^{-3}$.

When a voltage is applied between the third doped layer 39 and the gate electrode 35, the Zener diodes produce a capacitive voltage division. The main proportion of the voltage is dropped across the Zener diodes since their capacitance is small in comparison with the gate capacitance of the memory transistor. If a voltage which is lower than the breakdown voltage of the Zener diodes is present between the gate electrode 35 and the third doped layer 39, only a small voltage which is far below the value necessary for repolarizing the ferroelectric layer is dropped across the ferroelectric layer in the gate dielectric 34. If, in contrast, a voltage which is greater than the breakdown voltage of the Zener diodes is present between the third doped layer 39 and the gate electrode 35, the applied voltage is almost completely dropped across the ferroelectric layer. Since, according to the invention, the breakdown voltage of the Zener diodes is reached at voltages which are greater than the saturation field strengths of the ferroelectric layer, the voltage present across the ferroelectric layer is then sufficient for repolarization.

Due to the finite reverse impedance of the Zener diodes, the substrate potential of the memory cell approaches the potential of the third doped layer 39 with a time constant of $\tau = R_z \times C_{cell}$, $R_z$ being the reverse impedance of the Zener diodes and $C_{cell}$ being the capacitance of the memory cell. This time constant must be selected in such a manner that it is large in comparison with the period of time during which the voltage levels for writing-in the information are present across the memory cell. The following values are used, for example: time constant 1 μs, time period 5–10 ns, voltage level 3.3 V.

Figure 6:
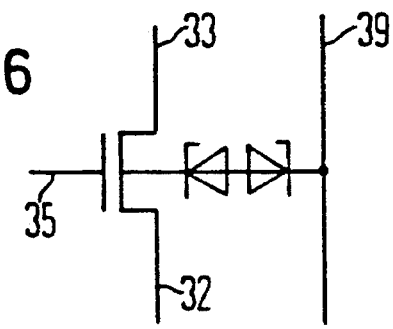
FIG. 6 shows an equivalent circuit of the memory cells shown in FIG. 5.

FIG. 6 shows an equivalent circuit for a memory cell as has been described with reference to FIG. 5. Two Zener diodes are connected in series with opposite polarity between the gate electrode 35 and the third doped layer 39.

Figure 7:
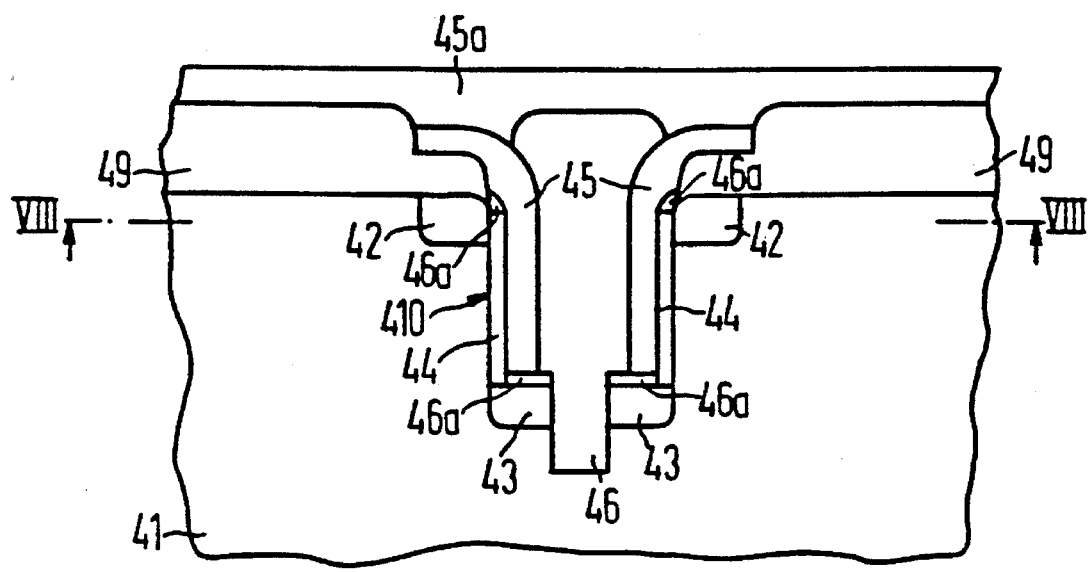
FIG. 7 shows a memory cell arrangement with memory cells arranged in a longitudinal trench.

A trench 410 is provided in a substrate 41 of, for example, p-doped monocrystalline silicon (see FIG. 7). A gate dielectric 44 is in each case arranged at two opposite sides of the trench 410. On the bottom of the trench 410, an n⁺-doped drain region 43 is arranged adjoining the gate dielectric 44 in the substrate 41. On the surface of the substrate 41, an n⁺-doped source region 42 is arranged laterally at the gate dielectric 44. Outside the trench 410, the surface of the substrate 41 is provided with an insulation layer 49. On the gate dielectric 44, a gate electrode 45 of, for example, polysilicon, is arranged in such a manner that it is insulated by means of insulation areas 46a from the drain region 43 and from the source region 42 and that it laterally protrudes over the gate dielectric 44 and is partially arranged outside the trench 410 on the surface of the insulation layer 49. In this manner, one field-effect transistor each is arranged as a memory cell on the opposite sides of the trench 410.

The gate dielectric 44 in each case contains one ferroelectric layer so that the field-effect transistors exhibit different positive threshold voltages dependent on the polarization of the ferroelectric layer. The opposite gate electrodes 45 and the opposite drain regions 43 are insulated from one another by means of an insulation area 46. A BOX-type insulation, for example, is suitable as the insulation area 46. The insulation area 46 reaches deeper into the substrate 41 than the drain regions 43. The gate electrodes 45 are connected to one another via a word line 45a.

Figure 8:
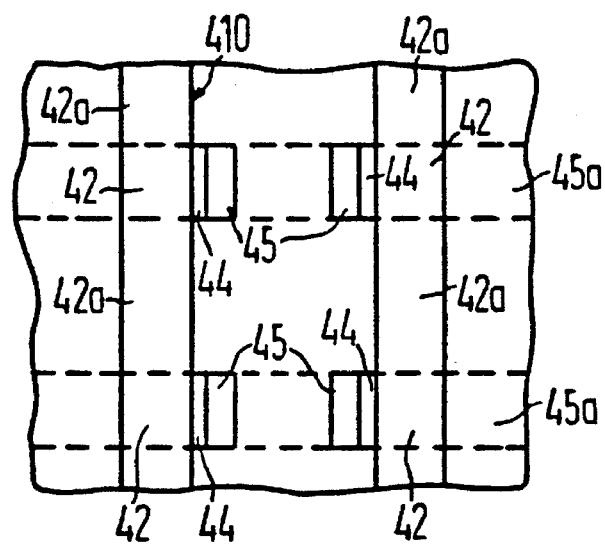
FIG. 8 shows the section designated by VIII—VIII in FIG. 7.

The trench 410 has an extent in one longitudinal direction perpendicular to the plane of the drawing (see also FIG. 8 which represents the section identified by VIII—VIII in FIG. 7). Field-effect transistors are arranged matrix-like in rows and columns in the memory cell arrangement according to the invention. In this arrangement, a row of field-effect transistors is in each case arranged on the side of a trench 410. A second row of field-effect transistors is in each case arranged on the opposite side of the same trench 410. Further trenches extend in parallel thereto in the substrate 41.

In parallel with the sides of the trench 410, the source regions 42 in each case arranged along a side of the trench 410 are connected to one another via bit lines 42a. The gate electrodes 45 of the field-effect transistors in each case arranged in a column are connected to one another via the word lines 45a. The extent of the word lines 45a is indicated by dashed lines in FIG. 8.

Figure 9:
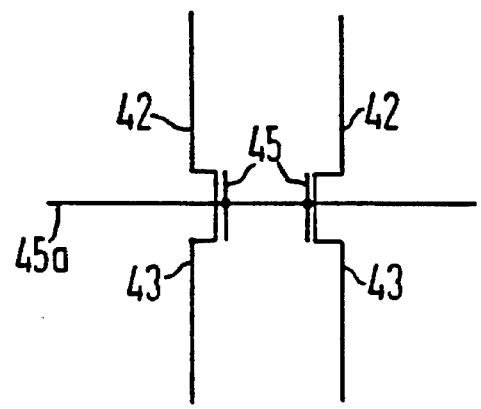
FIG. 9 shows an equivalent circuit of the memory cell arrangement shown in FIG. 7.

FIG. 9 represents an equivalent circuit of a pair of memory cells as has been explained with reference to FIG. 7.

In a substrate 51 which consists, for example, of p-doped monocrystalline silicon, field-effect transistors are arranged as memory cells, matrix-like in rows and columns (see FIG. 10). In this arrangement, in each case two rows of field-effect transistors are arranged on opposite sides of a trench 510 (see FIG. 10). The trench 510 has an extent perpendicular to the plane of the drawing.

A gate dielectric 54 is arranged on the side of the trench 510 for each field-effect transistor. The gate dielectric 54 contains a ferroelectric layer. In the substrate 51, a source region 52 is arranged on the side of the trench 510 in the upper area of the trench 510 in such a manner that it adjoins both the side of the trench 510 and the surface of the substrate 51. The source region 52 is, for example, n⁺-doped. On the side of the source region 52 facing away from the side of the trench 510, an insulation area 56 is in each case arranged in the substrate 510 in such a manner that the distance between the side of the trench 510 and the insulation area 56 is filled out by the source region 52 in the area of the source region 52. Perpendicular to the surface of the substrate 51, the insulation area 56 is extended into the substrate 51 by such an amount that a doped area 57, which is of the same type of conductivity as the substrate, that is to say, for example, p-doped, is completely surrounded by the insulation area 56, the source region 52, the gate dielectric 54 and a drain region 53 adjacent to the gate dielectric 54 and arranged at the bottom of the trench 510. The drain region 53 is, for example, n⁺-doped.

A gate electrode 55 is arranged on the side of the gate dielectric 54 facing away from the doped region 57. The gate electrode 55 consists, for example, of polycrystalline silicon and is arranged on the gate dielectric 54 in such a manner that it is insulated both from the source region 52 and from the drain region 53 by means of insulation area 56a and that it laterally protrudes over the gate dielectric 54 and is arranged at least partially on an insulation layer 59 arranged on the surface of the substrate 51. The two gate electrodes 55 are insulated from one another by a further insulation area 56b which completely fills out the trench 510. This further insulation area 56b also insulates the drain regions 53 from one another. The drain regions 53 completely fill out the space between the two insulation areas 56b adjacent to them.

The oppositely located gate electrodes 55 are connected to one another via a word line 55a. The word line 55a consists, for example, of polycrystalline silicon.

An individual substrate voltage is applied via the doped region 57 to the field-effect transistors of one row independently of the field-effect transistors along the remaining rows. The doped region 57 is completely insulated from the general substrate 51.

The embodiments of the invention explained with reference to FIG. 7 and FIG. 10 have the advantage that they have a very small area requirement per memory cell.

The field-effect transistors are n-channel transistors in the illustrative embodiments described herein. The invention can correspondingly also be carried out by means of p-channel transistors.

Although other modifications and changes may be suggested by those skilled in the art, it is the intention of the inventors to embody within the patent warranted hereon all changes and modifications as reasonably and properly come within the scope of their contribution to the art.

We claim:

1. A memory cell arrangement, comprising:

a semiconductor substrate, at least one field-effect transistor in said semiconductor substrate having a source region, a drain region, a gate dielectric and a gate electrode, said at least one field-effect transistor being a memory cell said semiconductor substrate being doped with a first type of conductivity and said source region and said drain region being doped with a second type of conductivity which is opposite to the first type of conductivity, said gate dielectric including at least one ferroelectric layer, said at least one field-effect transistor including a plurality of adjacent field-effect transistors in said semiconductor substrate, a word line connecting each gate electrode of said plurality of adjacent field-effect transistors to one another, insulation areas in said semiconductor substrate insulating said plurality of adjacent field-effect transistors from one another, a first doped layer doped with said first type of conductivity and a second doped layer doped with said second type of conductivity provided in said semiconductor substrate below each of said plurality of adjacent field-effect transistors, said insulation areas laterally bounding said first doped layer and said second doped layer for laterally insulating respective ones of said plurality of adjacent field-effect transistors, a third doped layer doped with the first type of conductivity and arranged below said second doped layer in said semiconductor substrate and a fourth doped layer doped with the second type of conductivity and arranged below said third doped layer, said insulation areas laterally bounding said third doped layer and said fourth doped layer for laterally insulating respective ones of said plurality of adjacent field-effect transistors, a dopant concentration of said first doped layer, of said second doped layer and of said third doped layer being of such a magnitude that Zener diodes are formed from said first doped layer and said second doped layer and from said second doped layer and said third doped layer having breakdown voltages which are exceeded by a voltage required for polarization of said ferroelectric layer.

2. A memory cell arrangement as claimed in claim 1, wherein said at least one field-effect transistor comprises a plurality of field-effect transistors, each with a gate dielectric containing a ferroelectric layer, a gate electrode, a source region and a drain region, said plurality of field-effect transistors being arranged matrix-like in rows and columns in said semiconductor substrate, b) said ferroelectric layer of each of said plurality of field-effect transistors being polarizable so as to have two different threshold voltages which have a same sign and which are allocated to two different logic states, c) said word line connected to each of said gate electrodes of each of said columns, a bit line connected to each of said source regions of each row, and a drain line connected to each of said drain regions of each row.

3. A memory cell arrangement as claimed in claim 1, wherein said semiconductor substrate is a silicon monocrystal.

4. A memory cell arrangement as claimed in claim 3, wherein said gate dielectric comprises a first $SiO_2$ layer, a ferroelectric layer and a second $SiO_2$ layer.

5. A memory cell arrangement as claimed in claim 4, wherein said ferroelectric layer and said $SiO_2$ layer are of materials having a ratio of the relative dielectric constants the material of the ferroelectric layer and of the $SiO_2$ essentially equal to a ratio between a thicknesses of said ferroelectric layer and said first $SiO_2$ layer.

6. A memory cell arrangement as claimed in claim 1, wherein said insulation areas include BOX-type insulations.

7. A memory cell arrangement, comprising:

a semiconductor substrate, at least one field-effect transistor in said semiconductor substrate having a source region, a drain region, a gate dielectric and a gate electrode, said at least one field-effect transistor being a memory cell, said semiconductor substrate being doped with a first type of conductivity and said source region and said drain region being doped with a second type of conductivity which is opposite to the first type of conductivity, said gate dielectric including at least one ferroelectric layer, at least one trench aligned perpendicularly to a surface of said semiconductor substrate is provided in said semiconductor substrate, said at least one field effect transistor being first and second field effect transistors, said first field effect transistor being on a first side of said at least one trench and said second field effect transistor being arranged on an opposite side of said at least one trench perpendicularly to a surface of said semiconductor substrate in said at least one trench, wherein each of said first and second field effect transistors has said gate dielectric and gate electrode, said gate dielectric of each of said first and second field effect transistors being arranged on a side of said at least one trench, said gate electrode being arranged on said gate dielectric in such a manner that it laterally protrudes over said gate dielectric and is partially arranged outside said at least one trench on a surface of said semiconductor substrate, an insulating structure which fills up said at least one trench and insulates said gate electrodes of said first and second field effect transistors from one another, wherein said first and second field effect transistors each have said source region and a drain region, said source region of each of said first and second field effect transistors being in said semiconductor substrate in such a manner that it adjoins both a side of said at least one trench and a surface of said semiconductor substrate, an insulation layer on said surface of said semiconductor substrate and between said source region and said gate electrode to insulate said source region from said gate electrode, said drain region of each of said first and second field effect transistors being arranged at a bottom of said at least one trench in said semiconductor substrate, said insulating structure extending into said semiconductor substrate at least by such an amount that it insulates said drain regions of said first and second field-effect transistors arranged in said at least one trench from one another, insulating areas on a side of said source region facing away from a side of said at least one trench, said insulating areas for each of said first and second field effect transistors being arranged in said semiconductor substrate in such a manner that a distance parallel to a plane of said substrate between a side of said at least one trench and said insulating area being filled by said source region in an area of said source region, said insulating areas penetrating in a direction perpendicular to a surface of said semiconductor substrate deeper into said semiconductor substrate than said drain region, said drain region completely filling a distance parallel to said plane of said substrate between said insulating structure and said insulating areas at a level parallel to said plane of said substrate of said drain region, a region doped with said first type of conductivity and being electrically insulated from said semiconductor substrate arranged between said source region and said drain region.

8. A memory cell arrangement as claimed in claim 7, wherein said at least one trench is of an extent in a longitudinal direction parallel to said surface of said semiconductor substrate so that a plurality of field-effect transistors are arranged adjacent to one another in the longitudinal direction on opposite sides of each of said at least one trench.

9. A memory cell arrangement as claimed in claim 7, wherein said at least one field-effect transistor comprises a plurality of field-effect transistors, being arranged matrix-like in rows and columns in said semiconductor substrate, said at least one ferroelectric layers of each of said plurality of field-effect transistors being polarizable so as to have two different threshold voltages which have a same sign and which are allocated to two different logic states, a word line connected to each of said gate electrodes of each of said columns, a bit line connected to each of said source regions of each row, and a drain line connected to each of said drain regions of each row.

10. A memory cell arrangement as claimed in claim 7, wherein said semiconductor substrate is a silicon monocrystal.

11. A memory cell arrangement as claimed in claim 10, wherein said gate dielectric comprises a first $SiO_2$ layer, a ferroelectric layer and a second $SiO_2$ layer.

12. A memory cell arrangement as claimed in claim 11, wherein said ferroelectric layer and said $SiO_2$ layer are of materials having a ratio of the relative dielectric constants essentially equal to a ratio between a thicknesses of said ferroelectric layer and said first $SiO_2$ layer.

* * * * *